US012765113B2

(12) United States Patent
Yu et al.

(10) Patent No.: US 12,765,113 B2
(45) Date of Patent: *Oct. 13, 2026

(54) SOLAR CELL AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Ding Yu, Haining (CN); Zhao Wang, Haining (CN); Jie Yang, Haining (CN); Wenqi Li, Haining (CN); Jiahao Wu, Haining (CN); Hao Wang, Haining (CN); Jialei Chai, Haining (CN); Xiaowen Zhang, Haining (CN); Shijie Zhao, Haining (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/248,813

(22) Filed: Jun. 25, 2025

(65) Prior Publication Data

US 2025/0324816 A1 Oct. 16, 2025

Related U.S. Application Data

(63) Continuation of application No. 17/973,438, filed on Oct. 25, 2022, now Pat. No. 12,439,728, which is a (Continued)

(30) Foreign Application Priority Data

Apr. 29, 2022 (CN) ......................... 202210474482.9
Apr. 29, 2022 (CN) ......................... 202221032637.5

(51) Int. Cl.
*H10F 77/30* (2025.01)
*H10F 10/14* (2025.01)
(Continued)

(52) U.S. Cl.
CPC ......... *H10F 77/311* (2025.01); *H10F 10/146* (2025.01); *H10F 71/121* (2025.01);
(Continued)

(58) Field of Classification Search
CPC .... H10F 77/211; H10F 77/311; H10F 77/315; H10F 71/121; H10F 71/129; H10F 10/146; H10F 77/147; H10F 77/703
See application file for complete search history.

(56) References Cited

U.S. PATENT DOCUMENTS 11,489,080 B1 11/2022 Chen et al.
2012/0192941 A1* 8/2012 Schoop ............... H10F 77/1699 257/E31.004
(Continued)

FOREIGN PATENT DOCUMENTS

CN 102197495 A * 9/2011 ............. H05K 3/188
CN 102197495 B 2/2014
(Continued)

OTHER PUBLICATIONS

Machine translation of CN-110061072-A, Qu, Xiao-yong. (Year: 2019).*
(Continued)

*Primary Examiner* — Mayla Gonzalez Ramos
(74) *Attorney, Agent, or Firm* — Tucker Ellis LLP

(57) ABSTRACT

A solar cell, including a crystalline silicon substrate; a first passivation contact step provided on a surface of the crystalline silicon substrate; a second passivation contact step provided on a surface of the first passivation contact step away from the crystalline silicon substrate and located
(Continued)

corresponding to an electrode; a first passivation antireflection step provided on the surface of the first passivation contact step away from the crystalline silicon substrate and not in contact with the second passivation contact step; a second passivation antireflection step provided on a surface of the second passivation contact step away from the first passivation contact step; and the electrode including a side in contact with the first passivation contact step and another side penetrating through the second passivation contact step and the second passivation antireflection step.

20 Claims, 6 Drawing Sheets

Related U.S. Application Data continuation of application No. PCT/CN2022/124851, filed on Oct. 12, 2022.

(51) Int. Cl.
*H10F 71/00* (2025.01)
*H10F 77/20* (2025.01)

(52) U.S. Cl.
CPC ......... *H10F 71/129* (2025.01); *H10F 77/211* (2025.01); *H10F 77/315* (2025.01)

(56) References Cited

U.S. PATENT DOCUMENTS

| | | | |
|---|---|---|---|
| 2020/0287066 A1 | 9/2020 | Stodolny et al. |
| 2021/0217907 A1 | 7/2021 | Chen et al. |
| 2022/0029040 A1 | 1/2022 | Yin et al. |
| 2022/0102568 A1 | 3/2022 | Yang et al. |

FOREIGN PATENT DOCUMENTS

| | | | | | |
|---|---|---|---|---|---|
| CN | 105762234 A | * | 7/2016 | H10F 71/129 |
| CN | 106098146 A | * | 11/2016 | H01B 1/22 |
| CN | 105762234 B | | 12/2017 | |
| CN | 110061072 A | * | 7/2019 | H10F 71/121 |
| CN | 110473926 A | | 11/2019 | |
| CN | 209912878 U | | 1/2020 | |
| CN | 209981229 U | | 1/2020 | |
| CN | 110752261 A | | 2/2020 | |
| CN | 110890432 A | | 3/2020 | |
| CN | 111199962 A | | 5/2020 | |
| CN | 111710743 A | | 9/2020 | |
| CN | 112736159 A | | 4/2021 | |
| CN | 112968074 A | | 6/2021 | |
| CN | 110610997 B | | 2/2022 | |
| CN | 215815893 U | * | 2/2022 | |
| CN | 217306520 U | | 8/2022 | |
| CN | 112885925 B | | 10/2022 | |
| CN | 112164728 B | | 3/2025 | |
| JP | 2022128577 A | | 9/2022 | |
| WO | 2020180244 A1 | | 9/2020 | |
| WO | 2021227568 A1 | | 11/2021 | |

OTHER PUBLICATIONS

Machine translation of CN-102197495-A, Ahn, Seh-Won. (Year: 2011).*
Machine translation of CN-105762234-A, Gao, Ping-qi. (Year: 2016).*
Machine translation of CN-106098146-A, Zhu, Peng. (Year: 2016).*
Machine translation of CN-215815893-U, Chen, Da-ming. (Year: 2022).*
International Search Report from corresponding International Application No. PCT/CN2022/124851, mailed on Jan. 12, 2023; 5 pages.
Fell, A. et al., "Modeling parasitic absorption in silicon solar cells with a near-surface absorption parameter," Elsevier Solar Energy Materials and Solar Cells 236 (2022) 111534, Dec. 6, 2021, 7 pages.
Lee, C. et al., "Amorphous Silicon Thin Film Deposition for Poly-Si/SiO2 Contact Cells to Minimize Parasitic Absorption in the Near-Infrared Region," MDPI Energies 2021, 14, 8199, Dec. 7, 2021, 9 pages.
Office Action from corresponding Australian Patent Application No. 2022331905, Feb. 13, 2024, 8 pages.
Japanese Office Action from corresponding Application No. 2023-514503 mailed on Jun. 25, 2024, 7 pages with translation.
Extended European Search Report from corresponding Application No. 22859544.3 mailed on Oct. 4, 2024, 6 pages.
Chinese Office Action from corresponding Application No. 202210474482.9 mailed on Sep. 24, 2025, 16 pages with translation.
Notice of Allowance from Chinese Application No. 202210474482.9 mailed on Aug. 19, 2026, 6 pages with translation.

* cited by examiner

SOLAR CELL AND PHOTOVOLTAIC MODULE

This application is a continuation of U.S. application Ser. No. 17/973,438, filed on Oct. 25, 2022, which is a continuation of International Application No. PCT/CN2022/124851, filed on Oct. 12, 2022, which claims priority to Chinese Patent Application No. 202210474482.9, filed on Apr. 29, 2022 and to Chinese Patent Application No. 202221032637.5, filed on Apr. 29, 2022, the contents of which are incorporated herein by reference in their entireties.

TECHNICAL FIELD

The present disclosure relates to the technical field of solar cells, and in particular, to a solar cell and a photovoltaic module.

BACKGROUND

A Tunnel Oxide Passivating Contacts (TOPCon) solar cell is a type of solar cell based on principles of a selective carrier. A combined structure of an ultrathin tunnel silicon oxide with a doped polysilicon film is generally adopted on a rear surface thereof to achieve the passivation contact effect.

In the related art, in order to ensure matching and passivation effects of metallized paste, the doped polysilicon film is made thicker. However, the excessively thick doped polysilicon film may lead to infrared-band parasitic absorption on the rear surface, thereby leading to the problems of poor long-wave response and low double-side performance of the solar cell.

SUMMARY

In view of the above, the present disclosure provides a solar cell, which can reduce the thickness of the doped polysilicon film, thereby reducing infrared-band parasitic absorption and improving the long-wave response and the double-side performance of the solar cell.

In a first aspect, the present disclosure provides a solar cell, including a crystalline silicon substrate; a first passivation contact step provided on a surface of the crystalline silicon substrate; a second passivation contact step provided on a surface of the first passivation contact step away from the crystalline silicon substrate and located corresponding to an electrode; a first passivation antireflection step provided on the surface of the first passivation contact step away from the crystalline silicon substrate and not in contact with the second passivation contact step; a second passivation antireflection step provided on a surface of the second passivation contact step away from the first passivation contact step; and the electrode including a side in contact with the first passivation contact step and another side penetrating through the second passivation contact step and the second passivation antireflection step.

In one or more embodiments, the first passivation contact step includes a first tunnel oxide layer and a first doped polysilicon layer, the first tunnel oxide layer is provided on the surface of the crystalline silicon substrate, and the first doped polysilicon layer is provided on a side of the first tunnel oxide layer away from the crystalline silicon substrate. The second passivation contact step includes a second tunnel oxide layer and a second doped polysilicon layer, the second tunnel oxide layer is provided on a side of the first doped polysilicon layer away from the first tunnel oxide layer and located corresponding to the electrode; the second doped polysilicon layer is provided on a side of the second tunnel oxide layer away from the second doped polysilicon layer. One side of the electrode is in contact with the first doped polysilicon layer.

In one or more embodiments, the first tunnel oxide layer includes at least one of phosphorous-containing silicon oxide, aluminum oxide, silicon oxynitride, or silicon oxycarbide, and a phosphorus concentration of the first tunnel oxide layer is not greater than $9\times10^{20}$ cm$^{-3}$.

In one or more embodiments, a thickness of the first tunnel oxide layer ranges from 0.5 nm to 10 nm.

In one or more embodiments, a phosphorus concentration after activation of the first doped polysilicon layer ranges from $9\times10^{19}$ cm$^{-3}$ to $1\times10^{21}$ cm$^{-3}$.

In one or more embodiments, a thickness of the first doped polysilicon layer ranges from 3 nm to 150 nm.

In one or more embodiments, the second tunnel oxide layer includes at least one of phosphorous-containing silicon oxide, aluminum oxide, silicon oxynitride, or silicon oxycarbide, and a phosphorus concentration of the second tunnel oxide layer is not greater than $1\times10^{21}$ cm$^{-3}$.

In one or more embodiments, a thickness of the second tunnel oxide layer ranges from 0.1 nm to 5 nm, and the thickness of the second tunnel oxide layer is not greater than the first tunnel oxide layer.

In one or more embodiments, a patterned width of the second tunnel oxide layer ranges from 0.5% to 20% of a patterned width of the first doped polysilicon layer, and the patterned width of the second tunnel oxide layer is not greater than 1000 μm.

In one or more embodiments, a phosphorus concentration after activation of the second doped polysilicon layer ranges from $1\times10^{20}$ cm$^{-3}$ to $1\times10^{21}$ cm$^{-3}$.

In one or more embodiments, a thickness of the second doped polysilicon layer ranges from 5 nm to 300 nm, and the thickness of the second doped polysilicon layer is greater than the first doped polysilicon layer.

In one or more embodiments, a patterned width of the second doped polysilicon layer is not greater than a patterned width of the second tunnel oxide layer.

In one or more embodiments, the first passivation antireflection step includes at least one passivation antireflection layer, and a thickness of the first passivation antireflection step ranges from 30 nm to 300 nm and is not less than a thickness of the second passivation contact step.

In one or more embodiments, a thickness of the second passivation antireflection step ranges from 30 nm to 500 nm.

In one or more embodiments, a patterned width of the second passivation antireflection step is not greater than 1000 μm and not less than a patterned width of the second passivation contact step.

In one or more embodiments, a distance from the side of the electrode in contact with the first passivation contact step to a surface of the second passivation antireflection step away from the second passivation contact step is not less than 40 nm.

In a second aspect, the present disclosure provides a photovoltaic module, including the solar cell described in the first aspect, at least part of the solar cells is electrically connected in a splicing or laminating manner and packaged through a packaging material.

In a third aspect, the present disclosure provides a method for manufacturing a solar cell, including: etching and cleaning a surface of a crystalline silicon substrate; forming a first tunnel oxide layer over the surface of the crystalline silicon substrate; forming a first undoped polysilicon layer over a surface of the first tunnel oxide layer away from the crystalline silicon substrate; forming a second initial tunnel oxide layer on a surface of the first undoped polysilicon layer away from the first tunnel oxide layer; forming a second initial undoped polysilicon layer over a surface of the second initial tunnel oxide layer away from the first undoped polysilicon layer; diffusing the first undoped polysilicon layer and the second initial undoped polysilicon layer to form a first phosphorus-doped polysilicon layer and a second initial phosphorus-doped polysilicon layer respectively, and forming a phospho silicate glass (PSG) layer on a surface of the second initial phosphorus-doped polysilicon layer; applying an organic coating on a surface of the PSG layer, and drying the organic coating at a high temperature to form a patterned mask; etching a surface of the second initial phosphorus-doped polysilicon layer away from the second initial tunnel oxide layer and not covered by the patterned mask, to retain the first tunnel oxide layer, the first phosphorus-doped polysilicon layer, and the PSG layer, the second initial tunnel oxide layer, and the second initial phosphorus-doped polysilicon layer that are covered by the patterned mask, the first passivation contact step includes the first tunnel oxide layer and the first phosphorus-doped polysilicon layer; etching a surface of the patterned mask, to retain the first tunnel oxide layer, the first doped polysilicon layer, the second tunnel oxide layer, and the second phosphorus-doped polysilicon layer; forming a first passivation antireflection step and a second passivation antireflection step over surfaces of the first phosphorus-doped polysilicon layer and the second phosphorus-doped polysilicon layer away from the crystalline silicon substrate; and forming an electrode in a region corresponding to the second passivation contact step and the second passivation antireflection step.

In a fourth aspect, the present disclosure provides a method for manufacturing a solar cell, including etching and cleaning a surface of a crystalline silicon substrate; forming a first tunnel oxide layer on the surface of the crystalline silicon substrate; depositing in-situ doped polysilicon over a surface of the first tunnel oxide layer away from the crystalline silicon substrate to form a first initial phosphorus-doped polysilicon layer; forming a second initial tunnel oxide layer over a surface of the first initial phosphorus-doped polysilicon layer away from the first tunnel oxide layer; depositing in-situ doped polysilicon over a surface of the second initial tunnel oxide layer away from the first initial phosphorus-doped polysilicon layer to form a second initial phosphorus-doped polysilicon layer; forming a silicon oxide mask over a surface of the second initial phosphorus-doped polysilicon layer; applying an organic coating over a surface of the silicon oxide mask, and drying the organic coating at a high temperature to form a patterned mask; etching a surface of the second initial phosphorus-doped polysilicon layer away from the second initial tunnel oxide layer and not covered by the patterned mask, to retain the first tunnel oxide layer, the first initial phosphorus-doped polysilicon layer, and the silicon oxide mask, the second initial tunnel oxide layer, and the second initial phosphorus-doped polysilicon layer that are covered by the patterned mask; etching a surface of the patterned mask, to retain the first tunnel oxide layer, the first initial phosphorus-doped polysilicon layer, the second initial tunnel oxide layer, and the second initial phosphorus-doped polysilicon layer; annealing the solar cell at a high temperature; forming a first passivation antireflection step and a second passivation antireflection step over surfaces of the first phosphorus-doped polysilicon layer and the second phosphorus-doped polysilicon layer away from the crystalline silicon substrate; and forming an electrode in a region corresponding to the second passivation contact step and the second passivation antireflection step.

Compared with the related art, the solar cell according to the present disclosure achieves at least the following beneficial effects.

In embodiments according to the present disclosure, multiple passivation contact steps are arranged. The first passivation contact step is arranged on the surface of the crystalline silicon substrate, which realizes surface passivation of the solar cell. The first passivation contact step is thinner, which can reduce parasitic absorption of long-wave band light and effectively improve a long-wave response and a double-side performance of the solar cell. The second passivation contact step is arranged on the side of the first passivation contact step away in from the crystalline silicon substrate and located in a region corresponding to the electrode. The second passivation contact step is thicker, which can ensure formation of good ohmic contact with metal paste during metallization.

It is appreciated that, any product implementing the present disclosure is not particularly required to achieve all the technical effects described above simultaneously.

Other features of the present disclosure and advantages thereof will become clear from the following detailed description of exemplary embodiments of the present disclosure with reference to the accompanying drawings.

BRIEF DESCRIPTION OF DRAWINGS

The accompanying drawings, which are incorporated in and constitute a part of the specification, illustrate embodiments of the present disclosure and, together with the description, serve to explain the principles of the present disclosure.

DESCRIPTION OF EMBODIMENTS

Various exemplary embodiments of the present disclosure are now described in detail with reference to the accompanying drawings. It should be noted that, unless otherwise stated, relative arrangement of the components and steps, the numerical expressions, and the values set forth in the embodiments are not intended to limit the scope of the present disclosure.

The following description of one or more exemplary embodiments is in fact merely illustrative, and in no way constitutes any limitations on the present disclosure and application or use thereof.

Technologies, methods, and devices known to those of ordinary skill in the related art may not be discussed in detail, but where appropriate, such technologies, methods, and devices should be considered as part of the specification.

In all the examples shown and discussed herein, any specific value should be construed as merely illustrative and not as any limitation. Therefore, other examples of exemplary embodiments may have different values.

It should be noted that similar reference signs and letters denote similar terms in the accompanying drawings, and therefore, once an item is defined in a drawing, there is no need for further discussion in the accompanying drawings.

In the related art, in order to ensure matching and passivation effects of metallized paste, the thickness of the doped polysilicon film is required to be controlled above 90 nm. However, the excessively thick doped polysilicon film may lead to infrared-band parasitic absorption on the rear surface, thereby leading to the problems of poor long-wave response and low double-side performance of the solar cell.

In order to solve the above problems existing in the related art, an embodiment of the present disclosure provides a solar cell, which can reduce the thickness of the doped polysilicon film, thereby reducing infrared-band parasitic absorption and improving the long-wave response and the double-side performance of the solar cell.

Figure 1:
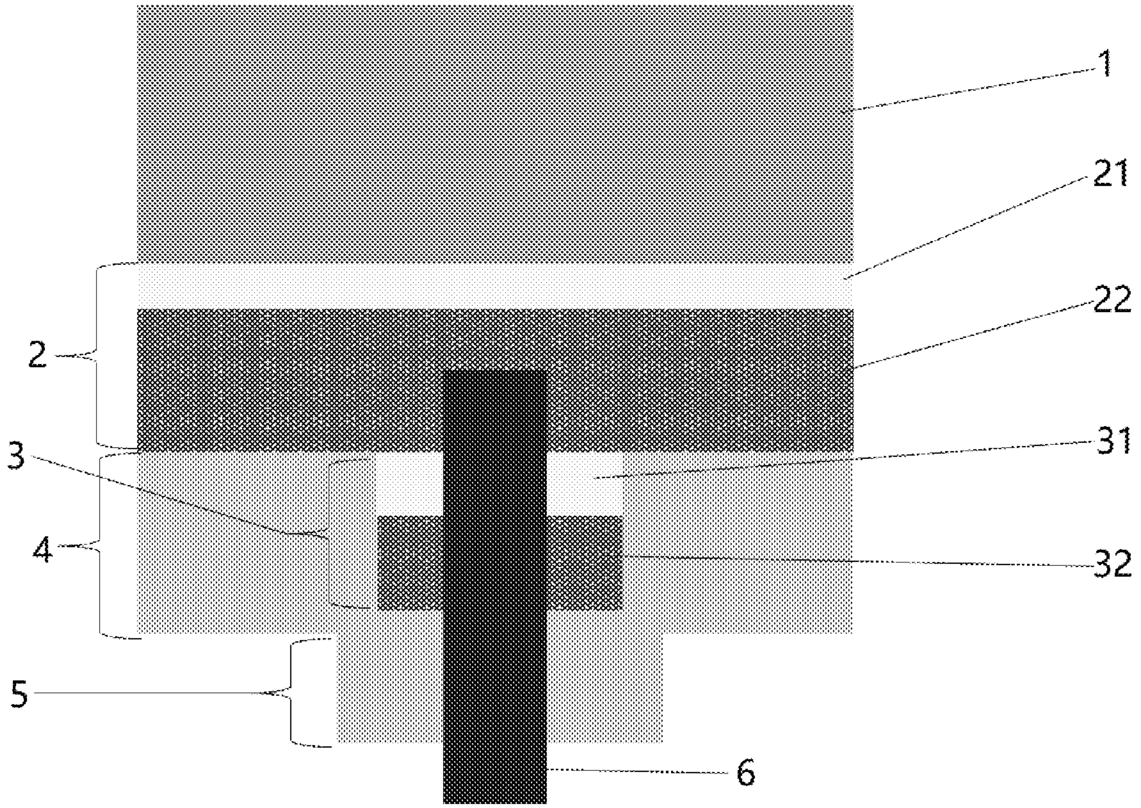
FIG. 1 is a schematic enlarged view of a local sectional structure of a solar cell according to one or more embodiments of the present disclosure.

Referring to FIG. 1, one or more embodiments of the present disclosure provide a solar cell, including a crystalline silicon substrate 1, a first passivation contact step 2, a second passivation contact step 3, a first passivation antireflection step 4, a second passivation antireflection step 5, and an electrode 6.

The first passivation contact step 2 is arranged on a surface of the crystalline silicon substrate 1.

The second passivation contact step 3 is arranged on a side of the first passivation contact step 2 away from the crystalline silicon substrate 1 and located in a region corresponding to the electrode 6.

The first passivation antireflection step 4 is arranged on a side of the first passivation contact step 2 away from the crystalline silicon substrate 1 and located in a region not in contact with the second passivation contact step 3.

The second passivation antireflection step 5 is arranged on a side of the second passivation contact step 3 away from the first passivation contact step 2.

The electrode 6 has one side (i.e., a first portion) in contact with the first passivation contact step 2 and the other side (i.e., a second portion) penetrating through the second passivation contact step 3 and the second passivation antireflection step 5. In some embodiments, the first portion of the electrode 6 is in contact with the first passivation contact step 2 but does not penetrate through the first passivation contact step 2, so as to reduce metal recombination caused by direct contact of the electrode with the substrate.

It is to be noted that the term “step” described in the present disclosure is similar to the design of a step structure. For example, a layer at the bottom of the step may be a layer covering an entire surface of the substrate, and a layer at the top of the step may be a layer covering the surface of the step.

It may be understood that the surface of the crystalline silicon substrate 1 may be an upper surface and/or a lower surface. In some embodiments, the upper surface refers to a light incident plane, that is, a surface facing the sun. The lower surface is a surface opposite to the upper surface. For a double-sided solar cell, the lower surface may also be used as a light receiving surface.

Figure 2:
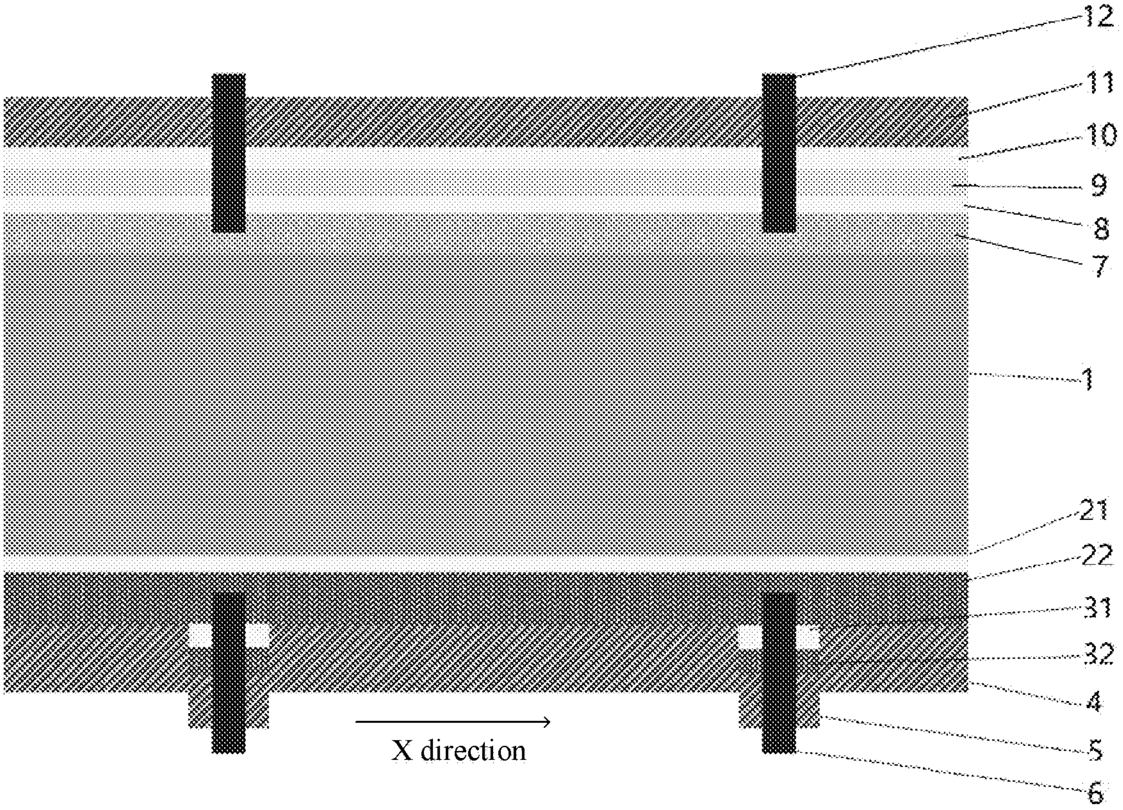
FIG. 2 is a first schematic diagram of a sectional structure of the solar cell according to one or more embodiments of the present disclosure.

Referring to FIG. 2, in some embodiments of the present disclosure, the first passivation contact step 2, the second passivation contact step 3, the first passivation antireflection step 4, the second passivation antireflection step 5, and the electrode 6 are arranged on the lower surface of the crystalline silicon substrate 1. In this case, a diffusion layer 7, an interface modification layer 8, a front passivation layer 9, a transition layer 10, a front passivation antireflection layer 11, and a front electrode 12 are successively arranged on the upper surface of the crystalline silicon substrate 1. The diffusion layer 7 may be located on the upper surface or the lower surface of the crystalline silicon substrate 1. When the crystalline silicon substrate 1 is an N-type crystalline silicon substrate, an element in the diffusion layer 7 is boron or other P-type doped elements. The interface modification layer 8 may be an oxide layer. For example, the interface modification layer 8 may be a silicon oxide layer. The interface modification layer 8 has a greater thickness ranging from 3 nm to 10 nm. The front passivation layer 9 may be at least one of silicon nitride, silicon oxynitride, silicon oxycarbonitride, titanium oxide, hafnium oxide, and aluminum oxide. The transition layer 10 may be at least one of silicon oxide and silicon oxynitride. The front passivation antireflection layer 11 may be at least one of silicon nitride, silicon oxynitride, and silicon oxycarbonitride. The interface modification layer 8, the front passivation layer 9, the transition layer 10, and the front passivation antireflection layer 11 constitute a front passivation antireflection structure of the solar cell. However, the structure is not limited to the above description and the accompanying drawings, the front passivation antireflection structure may also be a similar single-layer structure or a multi-layer structure.

Figure 3:
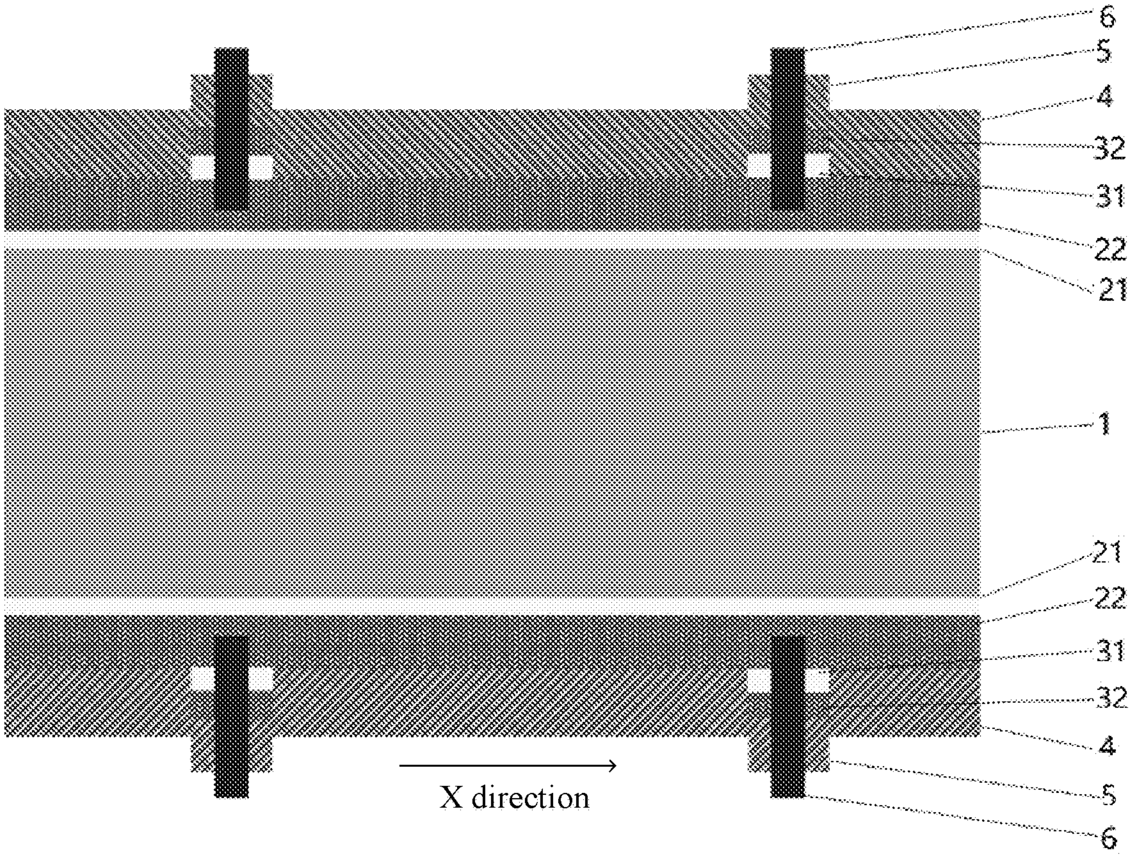
FIG. 3 is a second schematic diagram of a sectional structure of the solar cell according to one or more embodiments of the present disclosure.

Referring to FIG. 3, in some embodiments of the present disclosure, the first passivation contact step 2, the second passivation contact step 3, the first passivation antireflection step 4, the second passivation antireflection step 5, and the electrode 6 are arranged on the upper surface and the lower surface of the crystalline silicon substrate 1. In this case, the passivation contact steps are respectively a front passivation contact step and a rear passivation contact step, the passivation antireflection steps are respectively a front passivation antireflection step and a rear passivation antireflection step, and the electrode 6 includes a front electrode and a rear electrode.

Still referring to FIG. 1, in some embodiments of the present disclosure, the first passivation contact step 2 includes a first tunnel oxide layer 21 and a first doped polysilicon layer 22. The first tunnel oxide layer 21 is arranged on the surface of the crystalline silicon substrate 1, and the first doped polysilicon layer 22 is arranged on a side of the first tunnel oxide layer 21 away from the crystalline silicon substrate 1.

Referring to FIG. 1, a stepped passivation contact structure is adopted in embodiments of the present disclosure. A thickness of the first tunnel oxide layer 21 ranges from 0.5 nm to 10 nm. For example, the thickness of the first tunnel oxide layer 21 ranges from 0.5 nm to 3 nm. A thickness of the first doped polysilicon layer 22 ranges from 3 nm to 150 nm. For example, the thickness of the first doped polysilicon layer 22 ranges from 30 nm to 80 nm. In the first passivation contact step 2, a combined film layer of the first tunnel oxide layer 21 and the first doped polysilicon layer 22 is adopted, which can form good passivation effect on the surface of the crystalline silicon substrate 1. At the same time, efficient separation of photogenerated carriers can be realized by forming PN junctions or high-low junctions.

Figure 4:
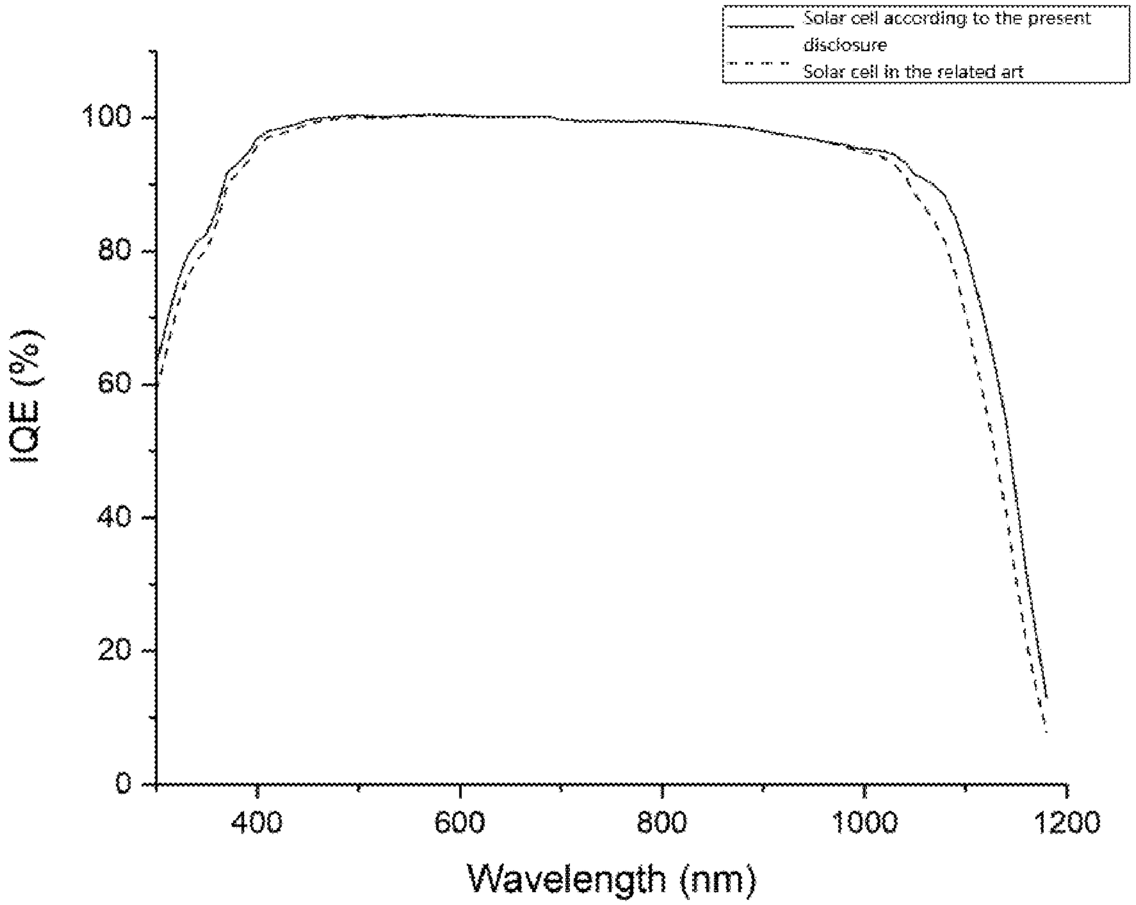
FIG. 4 is a diagram of Internal Quantum Efficiency (IQE) of a solar cell according to one or more embodiments of the present disclosure.

Referring to FIG. 4, internal quantum efficiency (IQE) of the solar cell provided with no stepped passivation contact structure on the surface in the related art is shown by the dotted line, and IQE of the solar cell provided with the stepped passivation contact structure according to the present disclosure is shown by the solid line. As can be known, compared with the related art, embodiments of the present disclosure can reduce infrared-band (from 1000 nm to 1200 nm) parasitic absorption, and the solar cell can obtain higher IQE in long-wave bands. An increase in IQE in a wave band of 1100 nm to 1150 nm may be greater than 10%.

The first tunnel oxide layer 21 includes at least one of phosphorous-containing silicon oxide, aluminum oxide, silicon oxynitride, and silicon oxycarbide.

A doped element of the first doped polysilicon layer 22 matches the crystalline silicon substrate 1. For example, when the crystalline silicon substrate 1 is an N-type crystalline silicon substrate, the doped element of the first doped polysilicon layer 22 is phosphorus or other N-type doped elements. When the crystalline silicon substrate 1 is a P-type crystalline silicon substrate, the doped element of the first doped polysilicon layer 22 is boron or other P-type doped elements.

It is to be noted that, when the first passivation contact step 2, the second passivation contact step 3, the first passivation antireflection step 4, the second passivation antireflection step 5, and the electrode 6 are provided on the upper surface and the lower surface of the crystalline silicon substrate 1, doped elements of the first doped polysilicon layer 22 and the second doped polysilicon layer 32 located on the upper surface of the crystalline silicon substrate 1 are opposite to doped elements of the first doped polysilicon layer 22 and the second doped polysilicon layer 32 located on the lower surface of the crystalline silicon substrate 1. For example, when the doped elements of the first doped polysilicon layer 22 and the second doped polysilicon layer 32 on the lower surface of the crystalline silicon substrate 1 are phosphorus or other N-type doped elements, the doped elements of the first doped polysilicon layer 22 and the second doped polysilicon layer 32 on the upper surface of the crystalline silicon substrate 1 are boron or other P-type doped elements.

When the doped element of the first doped polysilicon layer 22 is phosphorus, phosphorus concentration of the first tunnel oxide layer 21 after phosphorus diffusion is no greater than $9\times10^{20}$ $cm^{-3}$, for example, no greater than $5\times10^{19}$ $cm^{-3}$. Phosphorus concentration after activation of the first doped polysilicon layer 22 ranges from $9\times10^{19}$ $cm^{-3}$ to $1\times10^{21}$ $cm^{-3}$. For example, the phosphorus concentration after activation ranges from $1\times10^{20}$ $cm^{-3}$ to $3\times10^{20}$ $cm^{-3}$.

Still referring to FIG. 1, in some embodiments of the present disclosure, the second passivation contact step 3 includes a second tunnel oxide layer 31 and a second doped polysilicon layer 32. The second tunnel oxide layer 31 is arranged on the side of the first doped polysilicon layer 22 away from the first tunnel oxide layer 21 and located in the region corresponding to the electrode 6. The second doped polysilicon layer 32 is arranged on the side of the second tunnel oxide layer 31 away from the second doped polysilicon layer 32. One side of the electrode 6 is in contact with the first doped polysilicon layer 22.

It may be understood that a thickness of the second tunnel oxide layer 31 ranges from 0.1 nm to 5 nm. For example, the thickness ranges from 0.5 nm to 5 nm. The thickness of the second tunnel oxide layer 31 is no greater than the first tunnel oxide layer 21. A thickness of the second doped polysilicon layer 32 ranges from 5 nm to 300 nm, for example, the thickness ranges from 30 nm to 80 nm, and the thickness of the second doped polysilicon layer 32 is greater than the first doped polysilicon layer 22. In the second passivation contact step 3, a combined structure of the second tunnel oxide layer 31 and the second doped polysilicon layer 32 is adopted. The thicknesses of the second tunnel oxide layer 31 and the second doped polysilicon layer 32 are each greater than the thickness of the combined structure of the first tunnel oxide layer 21 and the first doped polysilicon layer 22. Therefore, the second passivation contact step 3 is entirely thicker, which can ensure formation of good ohmic contact with metal paste during metallization.

Referring to FIG. 2, the second tunnel oxide layer 31 corresponds to the region of the electrode 6, a plurality of electrodes 6 may be provided, and a plurality of second passivation contact steps 3 may be provided. That is, a plurality of second tunnel oxide layers 31 are provided. A patterned width of the second tunnel oxide layer 31 ranges from 0.5% to 20% of a patterned width of the first doped polysilicon layer 22. For example, the patterned widths of the two account for 1% to 7%, and the patterned width of the second tunnel oxide layer 31 is no greater than 1000 μm, especially no greater than 100 μm. Moreover, a patterned width of the second doped polysilicon layer 32 is no greater than the second tunnel oxide layer 31. The patterned width refers to a width in a direction X of a sectional structure of the solar cell.

The second tunnel oxide layer 31 includes at least one of phosphorous-containing silicon oxide, aluminum oxide, silicon oxynitride, and silicon oxycarbide.

A doped element of the second doped polysilicon layer 32 is the same as the first doped polysilicon layer 22, and they both match the crystalline silicon substrate 1. When the crystalline silicon substrate 1 is an N-type crystalline silicon substrate, the doped element of the second doped polysilicon layer 32 is phosphorus. When the crystalline silicon substrate 1 is a P-type crystalline silicon substrate, the doped element of the second doped polysilicon layer 32 is boron.

When the doped element of the second doped polysilicon layer 32 is phosphorus, phosphorus concentration of the second tunnel oxide layer 31 after phosphorus diffusion is no greater than $1\times10^{21}$ $cm^{-3}$, for example, from $8\times10^{19}$ $cm^{-3}$ to $2\times10^{20}$ $cm^{-3}$. Phosphorus concentration after activation of the second doped polysilicon layer 32 ranges from $1\times10^{20}$ $cm^{-3}$ to $1\times10^{21}$ $cm^{-3}$, for example, $2\times10^{20}$ $cm^{-3}$ to $4\times10^{20}$ $cm^{-3}$.

Still referring to FIG. 1, in some embodiments of the present disclosure, the first passivation antireflection step 4 includes at least one passivation antireflection layer. The passivation antireflection layer includes at least one of silicon nitride, silicon oxynitride, and silicon oxide. A thickness of the first passivation antireflection step 4 ranges from 30 nm to 300 nm, for example, from 70 nm to 110 nm, and is no less than the thickness of the second passivation contact step 3.

Still referring to FIG. 1, in some embodiments of the present disclosure, the second passivation antireflection step 5 includes at least one passivation antireflection layer. The passivation antireflection layer includes at least one of silicon nitride, silicon oxynitride, and silicon oxide. A thickness of the second passivation antireflection step 5 ranges from 30 nm to 500 nm, for example, from 50 nm to 110 nm. A patterned width of the second passivation antireflection step 5 is no greater than 1000 μm, for example, 100 μm, and no less than the patterned width of the second passivation contact step 3.

Still referring to FIG. 1, in some embodiments of the present disclosure, a distance from the side of the electrode 6 in contact with the first passivation contact step 2 to the surface of the second passivation antireflection step 5 away from the second passivation contact step 3 is no less than 40 nm, for example, no less than 100 nm.

It may be understood that the electrode 6 is made of silver, aluminum, or copper or an alloy formed by at least two of silver, aluminum, and copper. A patterned width of the electrode 6 is no greater than 100 nm and no greater than the patterned width of the second passivation contact step 3.

Based on the above, the solar cell according to the present disclosure may achieve at least the following beneficial effects.

In the embodiments according to the present disclosure, multiple passivation contact steps are arranged. The first passivation contact step 2 is arranged on the surface of the crystalline silicon substrate 1, which realizes surface passivation of the solar cell. The first passivation contact step 2 is thinner, which can reduce parasitic absorption of long-wave band light and effectively improve a long-wave response and a double-side performance of the solar cell. The second passivation contact step 3 is arranged on the side of the first passivation contact step 2 away from the crystalline silicon substrate 1 and located in a region corresponding to the electrode 6. The second passivation contact step 3 is thicker, which can ensure formation of good ohmic contact with metal paste during metallization.

Based on the same inventive concept, embodiments of the present disclosure further provide a photovoltaic module. The photovoltaic module includes at least one solar cell described above, and at least part of the solar cells is electrically connected in a splicing or laminating manner and packaged through a packaging material.

In some embodiments, a plurality of solar cells are located in a same plane and electrically connected in the form of a certain gap (small gap) or no gap to form the photovoltaic module. In some embodiments, the plurality of solar cells are electrically connected in a mutually laminated (i.e., in different planes) manner to form the photovoltaic module. The solar cell may be any of the solar cells shown in FIG. 1 to FIG. 3.

It would be understood by those skilled in the art that the photovoltaic module and the foregoing solar cell are based on the same inventive concept and that the characteristics and advantages described previously for the solar cell are also applicable to the application of the photovoltaic module. Therefore, the photovoltaic module has at least the same characteristics and advantages as the foregoing solar cell. Details are not described herein again.

For example, the photovoltaic module may successively include, from bottom to top, a back plate, a packaging material, a solar cell string, a packaging material, and glass. The packaging material may be a packaging film material well known in the art such as ethylene vinyl acetate (EVA) or polyethylene-octene elastomer (POE). The solar cell string may be formed by the solar cells in a splicing or laminating manner, and gaps may exist or may not exist between the solar cells when the solar cell string is formed by the solar cells in a splicing manner.

Figure 5:
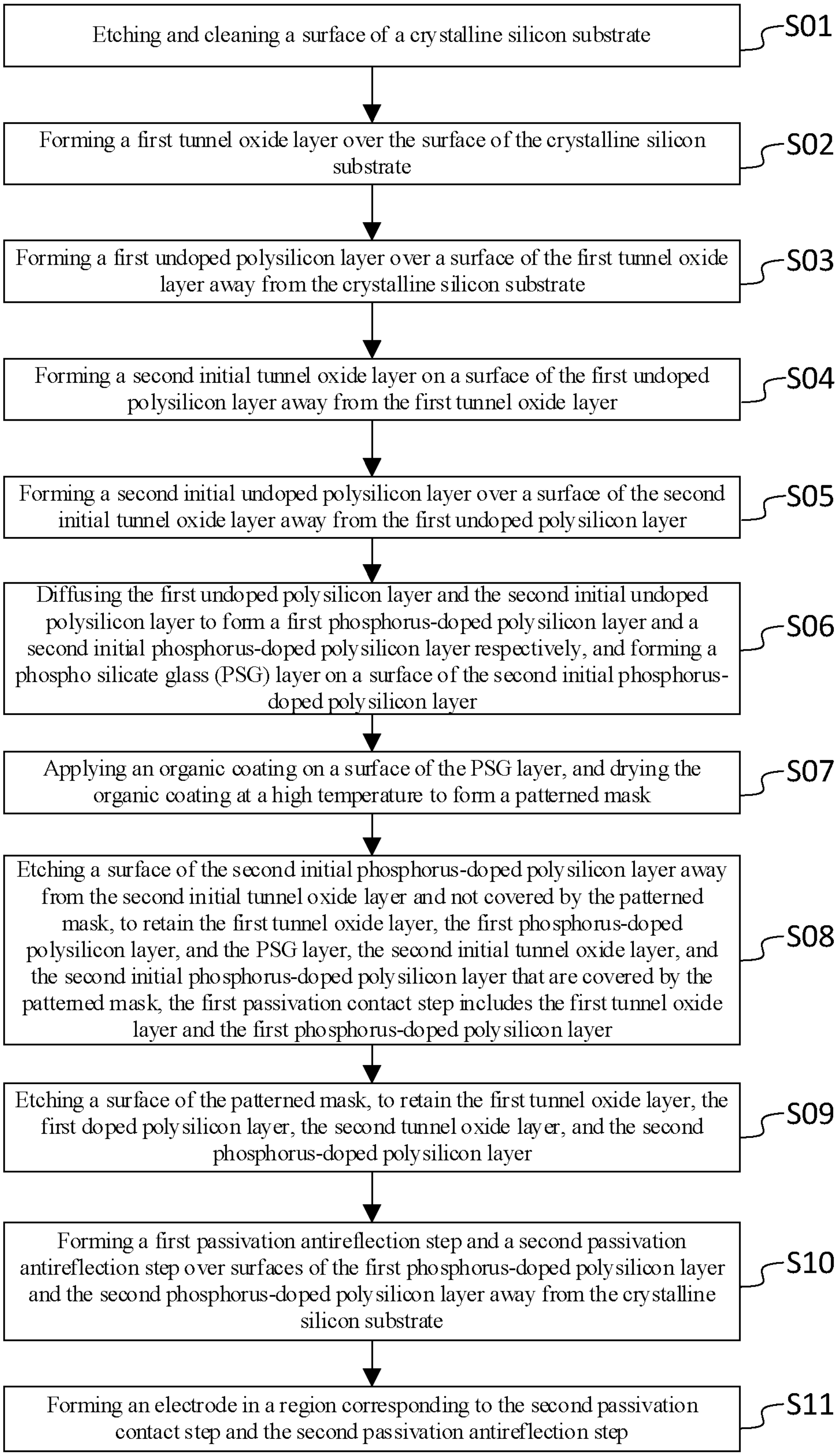
FIG. 5 is a first flowchart of a method for manufacturing a solar cell according to one or more embodiments of the present disclosure.

Based on the same inventive concept, embodiments of the present disclosure further provide a method for manufacturing a solar cell. Referring to FIG. 5, the method includes the following steps.

In S01, a surface of a crystalline silicon substrate 1 is etched and cleaned.

It may be understood that the surface of the crystalline silicon substrate 1 may be etched and cleaned by wet chemical etching, to obtain a smooth surface of the crystalline silicon substrate 1.

In S02, a first tunnel oxide layer 21 is formed over the surface of the crystalline silicon substrate 1.

It may be understood that the first tunnel oxide layer 21 of 0.5 nm to 10 nm (e.g., 0.5 nm to 3 nm) may be formed over the surface of the crystalline silicon substrate 1 by thermal oxidation at a temperature above 600° C.

In S03, a first undoped polysilicon layer 22 is formed over a surface of the first tunnel oxide layer 21 away from the crystalline silicon substrate 1.

It may be understood that the first undoped polysilicon layer 22 having a thickness ranging from 3 nm to 150 nm (e.g., from 30 nm to 80 nm) may be formed over the surface of the first tunnel oxide layer 21 away from the crystalline silicon substrate 1 by either low pressure chemical vapor deposition or plasma enhanced chemical vapor deposition.

In S04, a second initial tunnel oxide layer is formed over a surface of the first undoped polysilicon layer away from the first tunnel oxide layer 21.

It may be understood that the second initial tunnel oxide layer having a thickness ranging from 0.1 nm to 5 nm (e.g., from 0.5 nm to 5 nm) may be formed over the surface of the first undoped polysilicon layer 22 away from the first tunnel oxide layer 21 by thermal oxidation at a temperature above 600° C., and the thickness of the second initial tunnel oxide layer is no greater than the first tunnel oxide layer.

In S05, a second initial undoped polysilicon layer is formed over a surface of the second initial tunnel oxide layer away from the first undoped polysilicon layer.

It may be understood that the second initial undoped polysilicon layer having a thickness ranging from 5 nm to 300 nm (e.g., from 30 nm to 80 nm) may be formed over the surface of the second initial tunnel oxide layer away from the first undoped polysilicon layer by either low pressure chemical vapor deposition or plasma enhanced chemical vapor deposition, and the thickness of the second initial undoped polysilicon layer is greater than the first undoped polysilicon layer.

In S06, the first undoped polysilicon layer and the second initial undoped polysilicon layer are diffused to form a first phosphorus-doped polysilicon layer and a second initial phosphorus-doped polysilicon layer respectively, and a Phospho Silicate Glass (PSG) layer is formed on a surface of the second initial phosphorus-doped polysilicon layer.

It may be understood that the diffusion may be low pressure diffusion. When the crystalline silicon substrate 1 is a P-type crystalline silicon substrate, the doped element is phosphorus. The first phosphorus-doped polysilicon layer obtained after phosphorus diffusion is the first doped polysilicon layer 22. Phosphorus concentration of the first phosphorus-doped polysilicon layer and phosphorus concentration of the second initial phosphorus-doped polysilicon layer range from $1\times10^{19}$ $cm^{-3}$ to $1\times10^{21}$ $cm^{-3}$.

In S07, an organic coating is printed on a surface of the PSG, and the organic coating is printed dried at a high temperature to form a patterned mask. A width of the patterned mask in a direction X is no greater than 1000 μm (e.g., no greater than 100 μm).

It may be understood that the organic coating is prepared by screen printing, and a shape of the patterned mask matches a shape of the second passivation contact step 3.

In S08, a surface of the second initial phosphorus-doped polysilicon layer away from the second initial tunnel oxide layer and not covered by the patterned mask is etched, and the first tunnel oxide layer 21, the first phosphorus-doped polysilicon layer, and the PSG layer, the second initial tunnel oxide layer, and the second initial phosphorus-doped polysilicon layer that are covered by the patterned mask are retained. The first passivation contact step 2 includes the first tunnel oxide layer 21 and the first phosphorus-doped polysilicon layer.

It may be understood that the crystalline silicon substrate 1 may be selectively etched for the first time by wet chemical etching. In the above step, the PSG layer, the second initial tunnel oxide layer, and the second initial phosphorus-doped polysilicon layer that are not covered by the patterned mask are etched. After the etching, the second initial phosphorus-doped polysilicon layer covered by the patterned mask is a second tunnel oxide layer 31, the second initial phosphorus-doped polysilicon layer is a second phosphorus-doped polysilicon layer, and the second phosphorus-doped polysilicon layer is a second doped polysilicon layer 32.

In S09, a surface of the patterned mask is etched, and the first tunnel oxide layer 21, the first doped polysilicon layer, the second tunnel oxide layer 31, and the second phosphorus-doped polysilicon layer are retained.

It may be understood that the crystalline silicon substrate 1 may also be selectively etched for the second time by wet chemical etching. In the above step, the patterned mask and the PSG layer covered by the patterned mask are etched.

In S10, a first passivation antireflection step 4 and a second passivation antireflection step 5 are formed over surfaces of the first phosphorus-doped polysilicon layer and the second phosphorus-doped polysilicon layer away from the crystalline silicon substrate 1.

It may be understood that the first passivation antireflection step 4 and the second passivation antireflection step 5 are prepared by plasma enhanced chemical vapor deposition. The first passivation antireflection step 4 and the second passivation antireflection step 5 are prepared using at least one of silicon nitride, silicon oxynitride, and silicon oxide, and have thicknesses ranging from 30 nm to 300 nm (e.g., from 70 nm to 110 nm).

In S11, an electrode 6 is prepared in a region corresponding to the second passivation contact step 3 and the second passivation antireflection step 5.

It may be understood that the electrode 6 is prepared by either screen printing or electroplating. A patterned width of the electrode 6 in the direction X is no greater than 100 nm.

Figure 6:
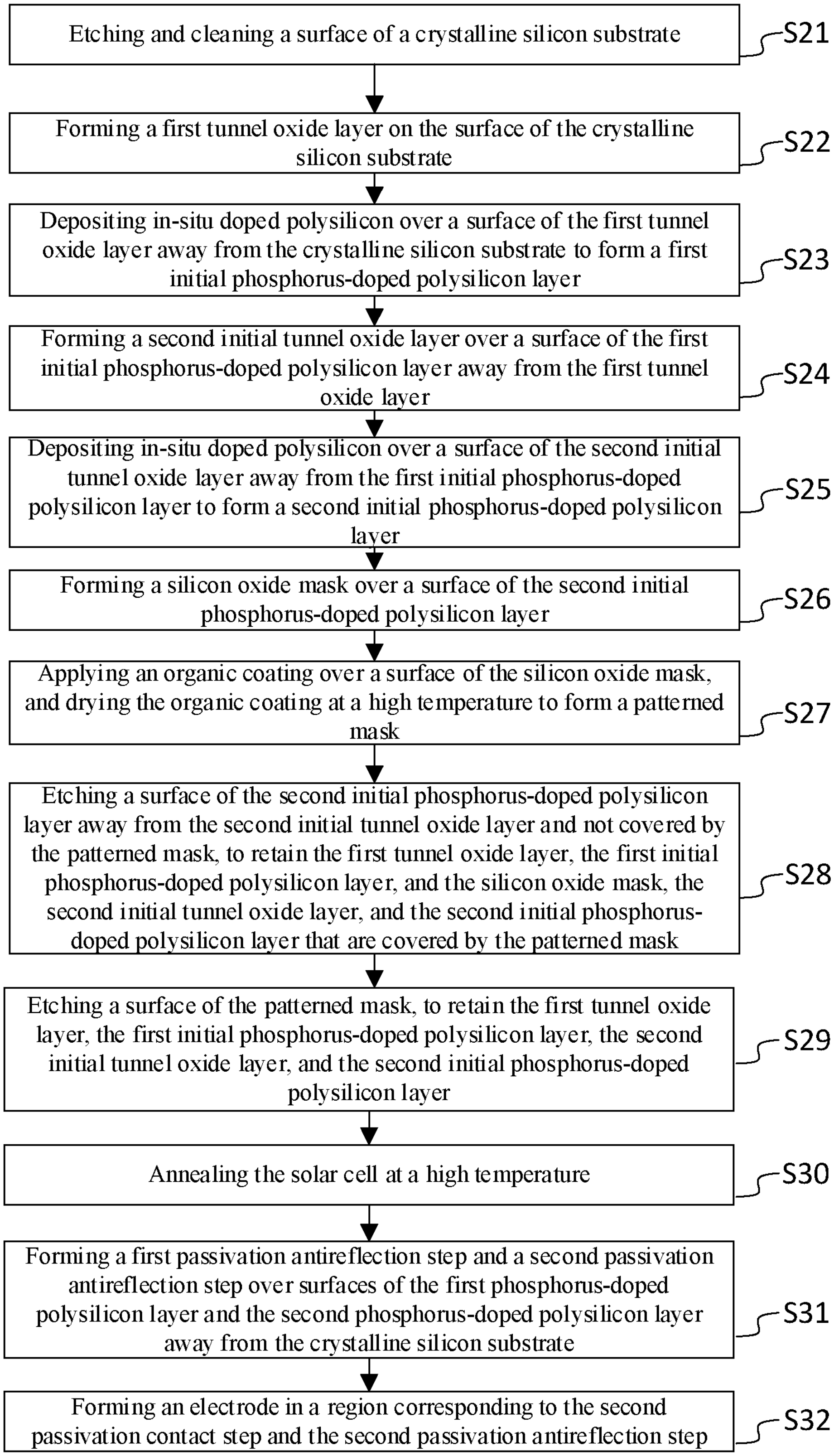
FIG. 6 is a second flowchart of a method for manufacturing a solar cell according to one or more embodiments of the present disclosure.

Embodiments of the present disclosure further provide another method for manufacturing a solar cell. Referring to FIG. 6, the method includes the following steps.

In S21, a surface of a crystalline silicon substrate 1 is etched and cleaned.

In S22, a first tunnel oxide layer 21 is formed over the surface of the crystalline silicon substrate 1.

In S23, in-situ doped polysilicon is deposited over a surface of the first tunnel oxide layer 21 away from the crystalline silicon substrate 1 to form a first initial phosphorus-doped polysilicon layer.

In S24, a second initial tunnel oxide layer is formed over a surface of the first initial phosphorus-doped polysilicon layer away from the first tunnel oxide layer 21.

In S25, in-situ doped polysilicon is deposited over a surface of the second initial tunnel oxide layer away from the first initial phosphorus-doped polysilicon layer to form a second initial phosphorus-doped polysilicon layer.

In S26, a silicon oxide mask is formed over a surface of the second initial phosphorus-doped polysilicon layer.

It may be understood that the silicon oxide mask may be prepared by plasma enhanced chemical vapor deposition, and a thickness of the silicon oxide mask is no less than 10 nm.

In S27, an organic coating is printed over a surface of the silicon oxide mask, and the organic coating is dried at a high temperature to form a patterned mask. A width of the patterned mask in a direction X is no greater than 1000 μm (e.g., no greater than 100 μm).

In S28, a surface of the second initial phosphorus-doped polysilicon layer away from the second initial tunnel oxide layer and not covered by the patterned mask is etched, and the first tunnel oxide layer 21, the first initial phosphorus-doped polysilicon layer, and the silicon oxide mask, the second initial tunnel oxide layer, and the second initial phosphorus-doped polysilicon layer that are covered by the patterned mask are retained.

It may be understood that the etched second initial tunnel oxide layer is a second tunnel oxide layer 31.

In S29, a surface of the patterned mask is etched, and the first tunnel oxide layer 21, the first initial phosphorus-doped polysilicon layer, the second initial tunnel oxide layer, and the second initial phosphorus-doped polysilicon layer are retained.

In S30, the solar cell is annealed at a high temperature.

It may be understood that an annealing temperature ranges from 750° C. to 950° C. After annealing, phosphorus impurities in the first initial phosphorus-doped polysilicon and the second initial phosphorus-doped polysilicon film layer are activated. Phosphorus concentration after the activation ranges from $1\times10^{20}$ $cm^{-3}$ to $1\times10^{21}$ $cm^{-3}$. The first initial phosphorus-doped polysilicon after the activation is a first phosphorus-doped polysilicon layer, and the first phosphorus-doped polysilicon layer is a first doped polysilicon layer 22. The second phosphorus-doped polysilicon after the activation is a second phosphorus-doped polysilicon layer, and the second phosphorus-doped polysilicon layer is a second doped polysilicon layer 32.

In S31, a first passivation antireflection step 4 and a second passivation antireflection step 5 are formed over surfaces of the first phosphorus-doped polysilicon layer and the second phosphorus-doped polysilicon layer away from the crystalline silicon substrate 1.

In S32, an electrode 6 is prepared in a region corresponding to the second passivation contact step 4 and the second passivation antireflection step 5.

Although some embodiments of the present disclosure have been described in detail through examples, it should be understood by those skilled in the art that the above examples are for illustrative purposes only and not intended to limit the scope of the present disclosure. It should be understood by those skilled in the art that the above embodiments can be modified without departing from the scope of the disclosure. The scope of the present disclosure is defined by the appended claims.

What is claimed is:

1. A solar cell, comprising:

a crystalline silicon substrate;

a first passivation contact step provided on a surface of the crystalline silicon substrate;

a second passivation contact step provided on a surface of the first passivation contact step away from the crystalline silicon substrate and located corresponding to an electrode;

a first passivation antireflection step provided at regions on the surface of the first passivation contact step away from the crystalline silicon substrate and not in contact with the second passivation contact step;

a second passivation antireflection step provided on a surface of the second passivation contact step away from the first passivation contact step; and the electrode including a side in direct contact with the first passivation contact step and another side penetrating through the second passivation contact step and the second passivation antireflection step.

2. The solar cell according to claim 1, wherein the side of the electrode in direct contact with the first passivation contact step does not penetrate through the first passivation contact step.

3. The solar cell according to claim 1, wherein the first passivation contact step comprises a first tunnel oxide layer and a first doped polysilicon layer, the first tunnel oxide layer is provided on the surface of the crystalline silicon substrate, and the first doped polysilicon layer is provided on a side of the first tunnel oxide layer away from the crystalline silicon substrate;

the second passivation contact step comprises a second tunnel oxide layer and a second doped polysilicon layer, the second tunnel oxide layer is provided on a side of the first doped polysilicon layer away from the first tunnel oxide layer and located corresponding to the electrode; the second doped polysilicon layer is provided on a side of the second tunnel oxide layer away from the first doped polysilicon layer; and one side of the electrode is in direct contact with the first doped polysilicon layer.

4. The solar cell according to claim 3, wherein the first tunnel oxide layer comprises at least one of phosphorous-containing silicon oxide, aluminum oxide, silicon oxynitride, or silicon oxycarbide, and a phosphorus concentration of the first tunnel oxide layer is not greater than $9\times10^{20}$ $cm^{-3}$.

5. The solar cell according to claim 3, wherein a thickness of the first tunnel oxide layer ranges from 0.5 nm to 10 nm.

6. The solar cell according to claim 3, wherein a phosphorus concentration after activation of the first doped polysilicon layer ranges from $9\times10^{19}$ $cm^{-3}$ to $1\times10^{21}$ $cm^{-3}$.

7. The solar cell according to claim 3, wherein a thickness of the first doped polysilicon layer ranges from 3 nm to 150 nm.

8. The solar cell according to claim 3, wherein the second tunnel oxide layer comprises at least one of phosphorous-containing silicon oxide, aluminum oxide, silicon oxynitride, or silicon oxycarbide, and a phosphorus concentration of the second tunnel oxide layer is not greater than $1\times10^{21}$ $cm^{-3}$.

9. The solar cell according to claim 3, wherein a thickness of the second tunnel oxide layer ranges from 0.1 nm to 5 nm, and the thickness of the second tunnel oxide layer is not greater than the first tunnel oxide layer.

10. The solar cell according to claim 3, wherein a patterned width of the second tunnel oxide layer ranges from 0.5% to 20% of a patterned width of the first doped polysilicon layer, and the patterned width of the second tunnel oxide layer is not greater than 1000 μm.

11. The solar cell according to claim 3, wherein a phosphorus concentration after activation of the second doped polysilicon layer ranges from $1\times10^{20}$ $cm^{-3}$ to $1\times10^{21}$ $cm^{-3}$.

12. The solar cell according to claim 3, wherein a thickness of the second doped polysilicon layer ranges from 5 nm to 300 nm, and the thickness of the second doped polysilicon layer is greater than the first doped polysilicon layer.

13. The solar cell according to claim 3, wherein a patterned width of the second doped polysilicon layer is not greater than a patterned width of the second tunnel oxide layer.

14. The solar cell according to claim 1, wherein the first passivation antireflection step comprises at least one passivation antireflection layer, and a thickness of the first passivation antireflection step ranges from 30 nm to 300 nm and is not less than a thickness of the second passivation contact step.

15. The solar cell according to claim 1, wherein a thickness of the second passivation antireflection step ranges from 30 nm to 500 nm.

16. The solar cell according to claim 1, wherein a patterned width of the second passivation antireflection step is not greater than 1000 μm and not less than a patterned width of the second passivation contact step.

17. The solar cell according to claim 1, wherein a distance from the side of the electrode in contact with the first passivation contact step to a surface of the second passivation antireflection step away from the second passivation contact step is not less than 40 nm.

18. The solar cell according to claim 1, wherein a patterned width of the electrode is not greater than 100 nm and not greater than a patterned width of the second passivation contact step.

19. The solar cell according to claim 1, wherein the first passivation contact step, second passivation contact step, the first passivation antireflection step, the second passivation antireflection step and the electrode are arranged on both an upper surface and a lower surface of the crystalline silicon substrate, or wherein the first passivation contact step, second passivation contact step, the first passivation antireflection step, the second passivation antireflection step and the electrode are arranged on the lower surface of the crystalline silicon substrate, and the upper surface of the crystalline silicon substrate includes: a diffusion layer, an interface modification layer, a front passivation layer, a transition layer, a front passivation antireflection layer, and a front electrode.

20. A photovoltaic module, comprising:

a plurality of solar cells, wherein at least part of the solar cells is electrically connected in a splicing or laminating manner and packaged through a packaging material, and at least one of the solar cells includes:

a crystalline silicon substrate;

a first passivation contact step provided on a surface of the crystalline silicon substrate;

a second passivation contact step provided on a surface of the first passivation contact step away from the crystalline silicon substrate and located corresponding to an electrode;

a first passivation antireflection step provided at regions on the surface of the first passivation contact step away from the crystalline silicon substrate and not in contact with the second passivation contact step;

a second passivation antireflection step provided on a surface of the second passivation contact step away from the first passivation contact step; and the electrode including a side in direct contact with the first passivation contact step and another side penetrating through the second passivation contact step and the second passivation antireflection step.

* * * * *